US012157029B2

(12) United States Patent
Uchida et al.

(10) Patent No.: US 12,157,029 B2
(45) Date of Patent: Dec. 3, 2024

(54) PROCESS APPARATUS AND PROCESS METHOD

(71) Applicants: KABUSHIKI KAISHA TOSHIBA, Tokyo (JP); Kioxia Corporation, Tokyo (JP); TOHOKU UNIVERSITY, Sendai (JP)

(72) Inventors: Kenya Uchida, Yokohama (JP); Hiroyuki Fukui, Yokkaichi (JP); Ikuo Uematsu, Yokohama (JP); Takeaki Iwamoto, Sendai (JP); Eunsang Kwon, Sendai (JP)

(73) Assignees: KABUSHIKI KAISHA TOSHIBA, Tokyo (JP); Kioxia Corporation, Tokyo (JP); TOHOKU UNIVERSITY, Sendai (JP)

( * ) Notice: Subject to any disclaimer, the term of this patent is extended or adjusted under 35 U.S.C. 154(b) by 727 days.

(21) Appl. No.: 17/305,535

(22) Filed: Jul. 9, 2021

(65) Prior Publication Data

US 2021/0331018 A1 Oct. 28, 2021

Related U.S. Application Data

(63) Continuation of application No. PCT/JP2020/002022, filed on Jan. 22, 2020.

(30) Foreign Application Priority Data

Jan. 25, 2019 (JP) .................................. 2019-011519

(51) Int. Cl.
*A62D 3/36* (2007.01)
*A62D 101/49* (2007.01)
*C23C 16/44* (2006.01)

(52) U.S. Cl.
CPC ............ *A62D 3/36* (2013.01); *C23C 16/4412* (2013.01); *A62D 2101/49* (2013.01)

(58) Field of Classification Search
None
See application file for complete search history.

(56) References Cited

U.S. PATENT DOCUMENTS 7,832,550 B2 * 11/2010 Jacksier ................ C23C 16/402
148/284
11,795,543 B2 * 10/2023 Uchida ................. B01D 53/79
(Continued)

FOREIGN PATENT DOCUMENTS

JP 01-257119 A 10/1989
JP 04-124011 A 4/1992
(Continued)

OTHER PUBLICATIONS

Mitsubishi Materials Corporation, "Investigative Report by the Accident Investigation Committee for the Explosion & Fire Accident occurred in the High-Purity Polycrystalline Silicon Manufacturing Facility at Yokkaichi Plant of Mitsubishi Materials Corporation", Jun. 12, 2014, 7 pages.
(Continued)

*Primary Examiner* — John J Figueroa
(74) *Attorney, Agent, or Firm* — Oblon, McClelland, Maier & Neustadt, L.L.P.

(57) ABSTRACT

According to an embodiment, a process apparatus performs processing on a byproduct generated in a reaction of a raw material including silicon and a halogen element or in a reaction between a raw material including silicon and a raw material including a halogen element. The apparatus includes a process liquid tank, a processing tank, a supplier and an exhauster. A process target member including the byproduct is introduced into the processing tank. The supplier supplies the process liquid from the process liquid tank
(Continued)

to the processing tank and performs processing on the byproduct with the supplied process liquid. The exhauster exhausts a gas generated by reaction between the process liquid and the byproduct from the processing tank.

8 Claims, 2 Drawing Sheets

(56) References Cited

U.S. PATENT DOCUMENTS

| | | | |
|---|---|---|---|
| 2004/0018746 A1* | 1/2004 | Arno | G01N 21/3504 438/758 |
| 2012/0052203 A1 | 3/2012 | Miyashita et al. | |
| 2013/0156950 A1* | 6/2013 | Yamada | C23C 16/4405 427/248.1 |
| 2017/0067152 A1 | 3/2017 | Hayashi | |
| 2021/0002760 A1 | 1/2021 | Uchida et al. | |
| 2021/0107799 A1* | 4/2021 | Chu | C01B 32/97 |

FOREIGN PATENT DOCUMENTS

| | | |
|---|---|---|
| JP | 531436 B | 5/2003 |
| JP | 2005-216911 A | 8/2005 |
| JP | 2005-319370 A | 11/2005 |
| JP | 2012-049342 A | 3/2012 |
| JP | 2013-197474 A | 9/2013 |
| JP | 2016-013965 A | 1/2016 |
| JP | 2017-054862 A | 3/2017 |
| JP | WO2019/181044 A1 | 9/2019 |

OTHER PUBLICATIONS

International Search Report issued Apr. 14, 2020 in PCT/JP2020/002022 filed on Jan. 22, 2020, 2 pages.

* cited by examiner

PROCESS APPARATUS AND PROCESS METHOD

CROSS-REFERENCE TO RELATED APPLICATIONS

This is a Continuation Application of PCT Application No. PCT/JP2020/002022, filed Jan. 22, 2020 and based upon and claiming the benefit of priority from prior Japanese Patent Application No. 2019-011519, filed Jan. 25, 2019, the entire contents of which are incorporated herein by reference.

FIELD

Embodiments described herein relate generally to a process apparatus and a process method.

BACKGROUND

Semiconductor silicon substrates are widely used as materials for forming various electronic circuits. In each case of forming such a semiconductor silicon substrate, and forming a film or an ingot containing a silicon-containing product, a silicon-containing product forming apparatus such as an epitaxial growth apparatus and a chemical phase growth apparatus is used.

An epitaxial growth apparatus includes a reaction chamber, and a supply tube and an emission tube which are connected with the reaction chamber. The reaction chamber is supplied with a source gas via the supply tube. Then, an emission gas is emitted from the reaction chamber via the emission tube. At the time of using an epitaxial growth apparatus, a substrate is placed in the reaction chamber under reduced pressure in an inert atmosphere. Then, by reacting the source gas introduced into the reaction chamber and the heated substrate, a film containing a silicon-containing product is formed on the substrate. As the source gas, for example, a mixed gas of a compound containing silicon and chlorine and hydrogen gas is used. The source gas that has reacted with the substrate in the reaction chamber is emitted outside the apparatus as an emission gas via the emission tube. The emission gas can contain a component in the source gas, for example a compound containing silicon and chlorine.

Here, the temperature in the reaction chamber is very high compared with that in the emission tube. Therefore, the compound containing silicon and chlorine contained in the emission gas emitted into the emission tube is cooled inside the emission tube, and can precipitate as a byproduct. The byproduct can contain a liquid substance having high viscosity, called oily silane, and a solid substance. The byproduct can contain a substance that is generated secondarily as a result of degeneration of the oily silane in air or water. There is a need to safely detoxify such a byproduct.

DETAILED DESCRIPTION

According to an embodiment, a process apparatus performs processing on a byproduct generated in a reaction of a raw material including silicon and a halogen element or in a reaction between a raw material including silicon and a raw material including a halogen element. The apparatus includes a process liquid tank, a processing tank, a supplier and an exhauster. The process liquid tank stores process liquid including a basic aqueous solution. A process target member including the byproduct is introduced into the processing tank. The supplier supplies the process liquid from the process liquid tank to the processing tank and performs processing on the byproduct in the processing tank with the supplied process liquid. The exhauster exhausts a gas generated by reaction between the process liquid and the byproduct from the processing tank.

Hereinafter, embodiments will be described with reference to FIG. 1 and FIG. 2.

(Byproduct)

First, a byproduct to be detoxified in the embodiment will be described. The byproduct can contain a liquid substance having high viscosity, called oily silane, and a solid substance. The byproduct can contain a substance that is generated secondarily as a result of degeneration of the oily silane in air or water. Such a byproduct includes halosilanes. The halosilanes contain one or more halogen elements belonging to group 17, and examples of the halogen elements include fluorine (F), chlorine (Cl), bromine (Br), and iodine (I). Halosilanes can be generated by reaction of the compound containing a halogen element and silicon. Halosilanes have a Si-α bond (α is one or more halogen elements selected from the group consisting of Cl, Br, F and I), and a Si—Si bond.

Examples of halosilanes include chlorosilanes and bromosilanes. Chlorosilanes contain chlorine as a halogen element, and have a Si—Cl bond and a Si—Si bond. Bromosilanes contain bromine as a halogen element, and have a Si—Br bond and a Si—Si bond. Halosilanes may include two or more halogen elements, and in one example, the halosilanes may contain any one halogen element other than chlorine, in addition to chlorine.

Halosilanes contained in a byproduct sometimes do not degenerate. On the other hand, halosilanes have a Si-α bond (α is one or more halogen elements selected from the group consisting of Cl, Br, F and I), and a Si—Si bond, and these bonds can show high reactivity with water and oxygen. Therefore, halosilanes rapidly react with water and oxygen in the atmosphere, and can degenerate into a substance having explosiveness.

Halosilanes contained in a byproduct can include halosilanes having a cyclic structure and halosilanes not having a cyclic structure. Halosilanes having a cyclic structure can include any one of the compounds having the structures shown in structural formulas (1) to (25). Therefore, halosilanes having a cyclic structure can have any one of a four-membered cyclic structure, five-membered cyclic structure, six-membered cyclic structure, seven-membered cyclic structure, eight-membered cyclic structure, and many-membered cyclic structure. In the structural formulas (1) to (25), X is one or more halogen elements selected from the group consisting of Cl, Br, F and I.

[Chemical 1]

(1)

[Chemical 2]

(2)

(3)

(4)

(5)

(6)

[Chemical 3]

(7)

(8)

(9)

(10)

[Chemical 4]

(11)

(12)

(13)

(14)

(15)

[Chemical 5]

(16)

(17)

(18)

(19)

[Chemical 6]

(20)

(21)

(22)

(23)

(24)

[Chemical 7]

(25)

Halosilanes having a cyclic structure contained in the byproduct can be a homocyclic compound having a silicon ring formed exclusively of silicon as shown in the structural formulas (1) to (25). The halosilanes having a cyclic structure can be an inorganic cyclic compound free of carbon as shown in the structural formulas (1) to (25). Halosilanes having a cyclic structure may include a heterocyclic compound formed of silicon and oxygen.

Halosilanes not having a cyclic structure can include halosilanes having a chain structure. Halosilanes having a chain structure can include either of the compounds having the structures shown in structural formulas (26) and (27). In the structural formula (26), N is, for example, 0, or a positive integer of 15 or less. In the structural formulas (26) and (27), X is one or more halogen elements selected from the group consisting of Cl, Br, F and I.

[Chemical 8]

(26)

(27)

Halosilanes having a chain structure can be a straight-chain compound without a branch as shown in the structural formula (26). Halosilanes having a chain structure can be a chain compound with a branch as shown in the structural formula (27).

The byproduct can include a hydrolysate that can be secondarily generated by contact of the aforementioned halosilanes with water. The hydrolysate can be a solid substance. The hydrolysate of halosilanes can have a Si—Si bond as with the halosilanes. The hydrolysate can be siloxanes. The hydrolysate can include a compound having at least one of a siloxane bond (Si—O—Si, O—Si—O) and a silanol group (—Si—OH). The hydrolysate can have a hydrosilanol group (—Si(H)OH). The hydrolysate contained in the byproduct can have any one of the structures indicated by structural formulas (28) to (33).

[Chemical 9]

(28)

(29)

(30)

(31)

(32)

(33)

The hydrolysates shown in the structural formulas (28) to (33) are hydrolysates consisting exclusively of silicon, oxygen, and hydrogen. The hydrolysates shown in the structural formulas (28) to (33) have both a siloxane bond and a silanol group. The hydrolysates shown in the structural formulas (28) to (33) are polysilanols having two or more silanol groups. In the hydrolysate contained in the byproduct, the Si—Si bond and the siloxane bond can be a cause of explosiveness. The byproduct can include silica.

Figure 1:
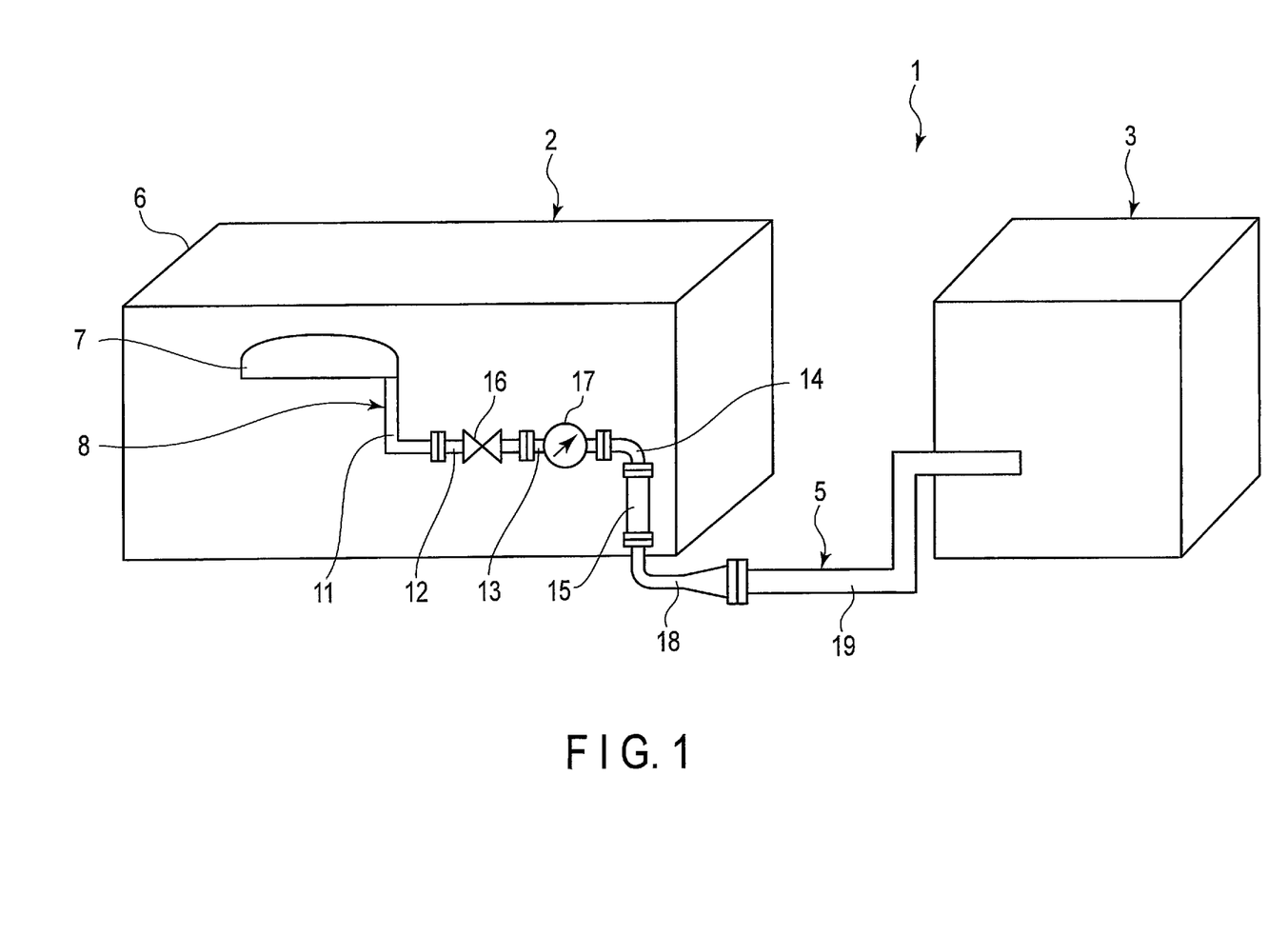
FIG. 1 is a schematic view showing an example of an epitaxial growth apparatus as an apparatus in which a byproduct as a process target of a process apparatus according to an embodiment is generated.

FIG. 1 shows an example of an epitaxial growth apparatus (silicon-containing product forming apparatus) as an apparatus in which a byproduct that may include the above-described halosilanes and hydrolysate is generated. An epitaxial growth apparatus 1 as an example of FIG. 1 includes an apparatus main body 2, a detoxification apparatus 3, and a joint 5. The apparatus main body 2 includes a casing 6, a reaction chamber 7, an emission tube 8, and a supply tube (not shown). The reaction chamber 7, the emission tube 8, and the supply tube are accommodated in the casing 6. One end of the supply tube is connected with the reaction chamber 7, and the other end of the supply tube is connected with a supply apparatus (not shown) including a supply source of a source gas which is a raw material.

One end of the emission tube 8 is connected with the reaction chamber 7, and the other end of the emission tube 8 is connected with the joint 5. The emission tube 8 includes pipes 11 to 15 (five pipes in the example of FIG. 1). In the apparatus main body 2, the pipes 11, 12, 13, 14, and 15 are arranged in this order from the near side (from the upstream side) with respect to the reaction chamber 7. The pipe 12 is provided with a chamber isolation valve (CIV) 16, and the pipe 13 is provided with a pressure control valve (PCV) 17. In the state in which the chamber isolation valve 16 is closed, maintenance can be performed only at a site on the side opposite to the reaction chamber 7 (downstream side) with respect to the chamber isolation valve 16 in the emission tube 8. One end of the joint 5 is connected with the pipe 15 of the emission tube 8, and the other end of the joint 5 is connected with the detoxification apparatus 3. The joint 5 includes pipes 18 and 19 (two pipes in the example of FIG. 1). In the epitaxial growth apparatus 1, the pipes 18 and 19 are arranged in this order from the near side (from the upstream side) with respect to the apparatus main body 2.

In the epitaxial growth apparatus 1, a source gas is supplied as a raw material from the supply apparatus via the supply tube and introduced into the reaction chamber 7. The source gas is a gas containing silicon and a halogen element. Therefore, the source gas includes one or more kinds of halogen elements, and silicon. The gas containing silicon and a halogen element is, for example, a mixed gas of a compound containing silicon and a halogen element, and hydrogen. The concentration of hydrogen in the mixed gas is, for example, 95% by volume or more. The compound containing silicon and a halogen element includes one or more compounds selected from the group consisting of a compound containing silicon and chlorine, a compound containing silicon and bromine, a compound containing silicon and fluorine, and a compound containing silicon and iodine. The compound containing silicon and a halogen element includes halosilanes.

The compound containing silicon and chlorine is, for example, any one of chlorosilanes such as dichlorosilane ($SiH_2Cl_2$), trichlorosilane ($SiHCl_3$), and tetrachlorosilane ($SiCl_4$), or a mixture of these chlorosilanes. When the compound containing silicon and chlorine is contained in the mixed gas, the mixed gas may contain at least either of monosilane ($SiH_4$) and hydrogen chloride (HCl). The compound containing silicon and bromine is, for example, any one of bromosilanes such as dibromosilane ($SiH_2Br_2$), tribromosilane ($SiliBr_3$), and tetrabromosilane ($SiBr_4$), or a mixture of these bromosilanes. When the compound containing silicon and bromine is contained in the mixed gas, the mixed gas may contain at least either of monosilane ($SiH_4$) and hydrogen bromide (HBr).

The source gas may include two or more halogen elements, and the source gas may contain any one or more halogen elements other than chlorine in addition to chlorine. In one example, the source gas is a mixed gas of a compound containing silicon and chlorine, hydrogen gas, and at least one of a compound containing a halogen element other than chlorine and a halogen gas other than chlorine gas. The compound containing a halogen element other than chlorine may contain silicon, or need not contain silicon. In another example, the source gas is a mixed gas of a compound containing a halogen element other than chlorine and silicon, hydrogen gas, and at least one of a compound containing chlorine and a chlorine gas. The compound containing chlorine may contain silicon, or need not contain silicon.

The pressure of the reaction chamber 7 can be reduced by the pressure control valve 17. As the pressure of the reaction chamber 7 is reduced by the pressure control valve 17, the pressure rises in a region on the side opposite to the reaction chamber 7 with respect to the pressure control valve 17, as compared with the region on the reaction chamber 7 side with respect to the pressure control valve in the emission tube 8. In the epitaxial growth apparatus 1, a substrate is placed in the reaction chamber under the condition that the pressure of the reaction chamber 7 is reduced. In the reaction chamber 7, the source gas supplied via the supply tube reacts with the substrate. At this time, the substrate is heated to the reaction temperature at which the substrate starts to react with the source gas or higher. In one example, the reaction temperature is 600° C. or more, and in another example, the reaction temperature is 1000° C. or more. A film containing monocrystalline or polycrystalline silicon is formed on the substrate by the thermochemical reaction between the source gas and the substrate under reduced pressure and high temperature as described above. The substrate is, for example, a monocrystalline silicon substrate.

Emission gas which is an emission material from the reaction chamber 7 is emitted to the detoxification apparatus 3 via the emission tube 8 and the joint 5. Therefore, the emission tube 8 and the joint 5 form an emission path from the reaction chamber 7. The emission gas can include a part that was not deposited on the substrate in the compound containing silicon and a halogen element contained in the source gas. Therefore, the emission gas can contain a part that was not deposited on the substrate in the halosilanes contained in the source gas. The emission gas can include a part that has not reacted in the reaction chamber 7, in the compound containing silicon and a halogen element contained in the source gas. The emission gas can include halosilanes generated by the reaction of the compound containing a halogen element and silicon in the reaction chamber 7. Further, the emission gas which is an emission material can contain the aforementioned monosilane (SiH$_4$), and can contain the aforementioned hydrogen halide such as hydrogen chloride (HCl) and hydrogen bromide (HBr). The emission gas is detoxified by combustion in the detoxification apparatus 3.

A byproduct generated in the reaction between the source gas and the substrate can precipitate in a part of the emission tube 8 and the joint 5. The byproduct is generated by reaction of components contained in the aforementioned emission gas, followed by solidification or liquefaction. For example, by reaction of halosilanes contained in the emission gas in the emission tube 8 or the joint 5, a byproduct can be generated. Reaction of halosilanes with other components contained in the emission gas in the emission tube 8 or the joint 5 can also result in generation of a byproduct. Because the byproduct is generated as described above, the byproduct contains the aforementioned halosilanes. The generated byproduct can adhere, for example, on the inner surfaces of the pipes 11 to 15 of the emission tube 8, the inner surfaces of the pipes 18 and 19 of the joint 5, or the like.

Here, the temperature is high in the pipes 11 and 12 or the like located near to the reaction chamber 7. In the region on the reaction chamber 7 side with respect to the pressure control valve 17 such as the pipes 11 and 12, the pressure is reduced as in the reaction chamber 7. Therefore, it is considered that it is difficult for polymerization of components contained in the emission gas to occur, and a byproduct is difficult to generate, in the region of the reaction chamber 7 side with respect to the pressure control valve 17 such as the pipes 11 and 12.

Also, as described above, the pressure rises in a region on the side opposite to the reaction chamber 7 with respect to the pressure control valve 17, as compared with the region on the reaction chamber 7 side with respect to the pressure control valve 17. Therefore, in the pressure control valve 17, the pressure rises on the downstream side as compared with the upstream side. Therefore, it is considered that the reaction between components contained in the emission gas is likely to proceed, and a byproduct is likely to be generated in the region neighboring the pressure control valve 17 on the downstream side. Therefore, it is considered that a byproduct is likely to be generated particularly at the site of the pipe 13 neighboring the pressure control valve 17 on the downstream side, and in the pipe 14. It is difficult for the aforementioned reaction between components contained in the emission gas to occur under reduced pressure.

The quantity of components which are raw materials of a byproduct in the emission gas is small in the pipe 15, the joint 5, and the like distanced on the downstream side from the pressure control valve 17. Therefore, it is considered that it is difficult to generate a byproduct in the pipe 15, the joint 5, and the like.

The byproduct can include, in addition to the halosilanes, the aforementioned hydrolysate that can be generated by contact of the aforementioned halosilanes with water. As described above, the hydrolysate can include a compound having at least one of a siloxane bond (Si—O—Si, O—Si—O) and a silanol group (—Si—OH). The byproduct can include silica as described above.

In a process apparatus and a process method according to embodiments, etc. described later, the above-described byproduct is a process target on which a process is performed. At this time, the pipes 11 to 15, 18 and 19 on which the byproduct is deposited are used as process target members. Therefore, a process target member contains a byproduct. In particular, a byproduct adhering to the pipe 13, 14, or the like on which the byproduct is considered to be easily deposited is treated by a process apparatus and a process method according to later-described embodiments, etc. As described above, a byproduct containing halosilanes and the like may degenerate into a substance having explosiveness in the atmosphere. Therefore, there is a need to detoxify the byproduct, and the later-described embodiments provide a process apparatus and a process method for detoxifying the byproduct.

The apparatus in which the aforementioned byproduct containing halosilanes and the like is generated is not limited to the aforementioned epitaxial growth apparatus. In a silicon-containing product formation apparatus of one example, the reaction chamber (for example, 7) is supplied with a raw material containing silicon and a raw material containing a halogen element by separate routes. The raw material including silicon can contain powdery (solid) silicon. The raw material including a halogen element can be a source gas that contains a hydrogen halide such as hydrogen chloride.

In the silicon-containing product forming apparatus of the present example, the reaction chamber (for example, 7) is not provided with a substrate such as a silicon substrate. In the reaction chamber, the raw material containing silicon and the raw material containing a halogen element that are introduced by the separate routes react. By the reaction between the raw material containing silicon and the raw material containing a halogen element, halosilanes and hydrogen are generated. By the reaction between halosilanes and hydrogen, a silicon-containing product is obtained. Halosilanes generated by the reaction between the raw material containing silicon and the raw material containing a halogen element can include chlorosilanes such as trichlorosilane (SiHCl$_3$). In the reaction in the reaction chamber, a hydrogen halide, a silicon tetrahalide, and the like can be generated.

Also in the silicon-containing product forming apparatus of the present example, the emission gas (emission material) emitted from the reaction chamber contains halosilanes, and the halosilanes contained in the emission gas can include the aforementioned chlorosilanes such as trichlorosilane. The emission gas from the reaction chamber can contain hydrogen, and can contain a hydrogen halide, a silicon tetrahalide and the like generated by the reaction in the reaction chamber. The hydrogen halide generated by the reaction in the reaction chamber can include hydrogen chloride (HCl). The silicon tetrahalide generated by the reaction in the reaction chamber can include silicon tetrachloride (SiCl$_4$).

In the silicon-containing product forming apparatus of the present example, the emission path (emission tube 8) of the emission gas (emission material) from the reaction chamber is provided with a cooler configured to cool the emission gas. The emission gas liquefies by being cooled by a cooler. Then, the liquid substance (emission material) generated by liquefaction of the emission gas is collected.

Also in the silicon-containing product forming apparatus of the present example, a byproduct can precipitate in the emission path by liquefaction of the emission gas by the cooler. The byproduct can contain a part that is not collected in the liquid substance of the emission gas, and remains in the emission path. The byproduct contains halosilanes contained in the emission gas, and can contain a hydrolysate of halosilanes. The hydrolysate of halosilanes can be a solid substance. The byproduct can contain a silicon tetrahalide or the like contained in the emission gas. In the emission path, a byproduct is likely to precipitate particularly in the cooler and its vicinity.

As described above, also in the silicon-containing product forming apparatus of the present example, a byproduct containing halosilanes and like can precipitate in the emission path. The byproduct generated in the silicon-containing product forming apparatus of the present example can also degenerate into a substance having explosiveness in the atmosphere. Therefore, there is a need to detoxify the byproduct, and later-described embodiments and the like provide a process apparatus and a process method that detoxify the byproduct.

First Embodiment

Figure 2:
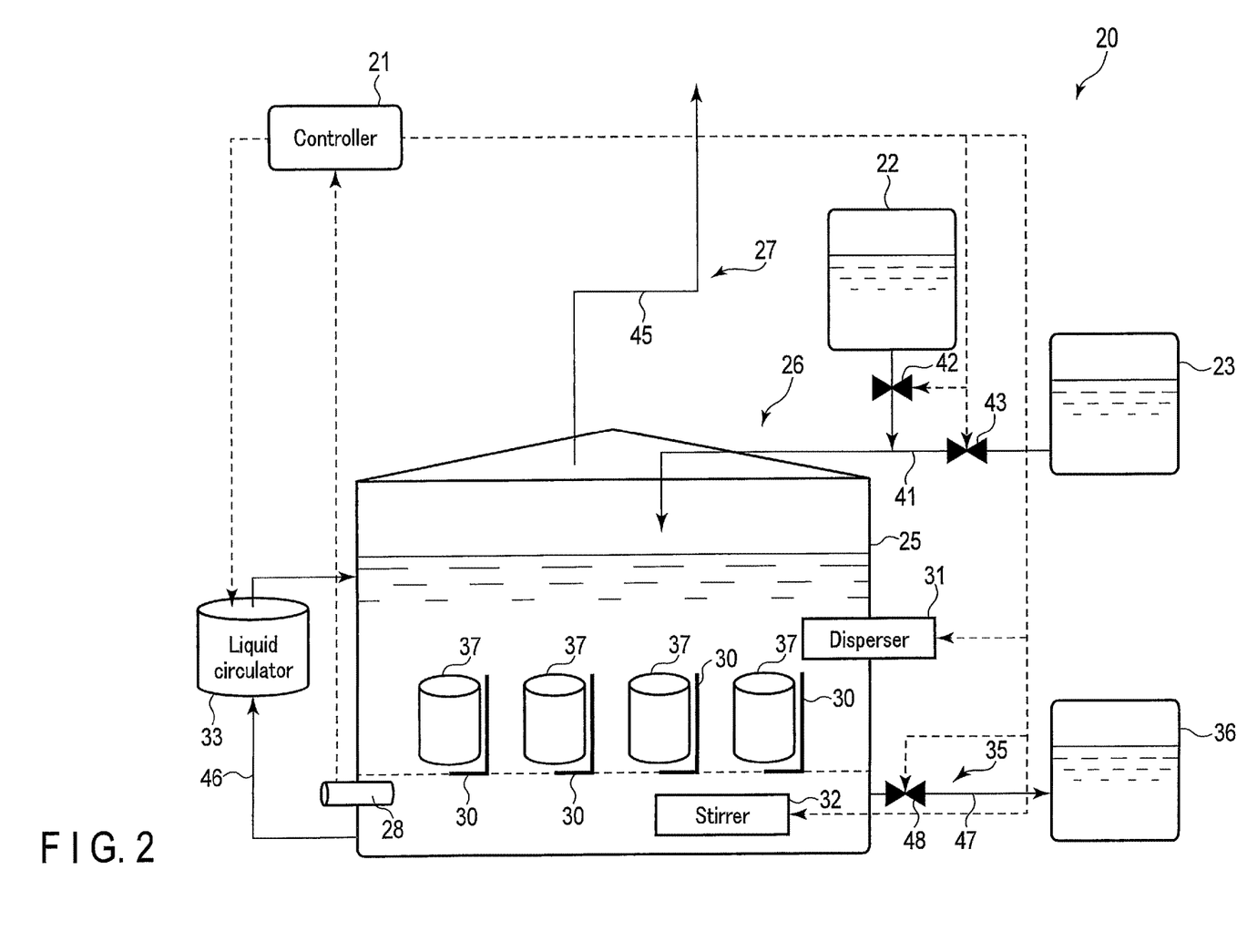
FIG. 2 is a schematic view showing a process apparatus according to a first embodiment.

FIG. 2 shows a process apparatus 20 according to the first embodiment as an example of a process apparatus that performs processing on the above-described byproduct. As shown in FIG. 2, the process apparatus. 20 includes a controller 21, a wash water tank 22, a process liquid tank 23, a processing tank 25, a supplier (supply system) 26, an exhauster (exhaust system) 27, a sensor 28, a jig 30, a disperser (dispersion device) 31, a stirrer (stirring device) 32, a liquid circulator (liquid circulation device) 33, a liquid emitter (liquid emission system) 35, and a waste liquid tank 36. In FIG. 2, the solid arrow indicates the flow of fluids such as liquid and gas, and the dotted arrow indicates electric signals such as input signals to the controller 21 and output signals from the controller 21.

The controller 21 controls the entire process apparatus 20. The controller 21 includes a processor or an integrated circuit (control circuit) including a central processing unit (CPU), an application specific integrated circuit (ASIC) or a field programmable gate array (FPGA), and a storage medium such as memory. The controller 21 may include only one processor or integrated circuit, or a plurality of processors or integrated circuits. The controller 21 performs processing by executing a program or the like stored in the storage medium.

The wash water tank 22 stores wash water. The process liquid tank 23 stores process liquid. The process liquid is used for detoxification of the byproduct described above. The process liquid includes a basic aqueous solution. The process target member 37 to which the above-described byproduct adheres is introduced into the processing tank 25. At this time, for example, the pipes 11 to 15 and the like in the example of FIG. 1 to which the byproduct adheres are introduced into the processing tank 25 as the process target members 37. Therefore, the process target member 37 includes the byproduct. Further, the emission tube 8 is disassembled for each pipe and introduced into the processing tank 25.

The supplier (liquid supplier) 26 enables supply of the wash water from the wash water tank 22 to the processing tank 25, and enables supply of the process liquid from the process liquid tank 23 to the processing tank 25. In the present embodiment, the supplier 26 includes a supply line 41, and valves 42 and 43. The supply line 41 is formed of, for example, one or more pipes. In the present embodiment, the processing tank 25 is connected to the wash water tank 22 and the process liquid tank 23 via the supply line 41. Furthermore, in the present embodiment, operations of the valves 42 and 43 are controlled by the controller 21, and the opening/closing of each of the valves 42 and 43 is switched by the controller 21.

When the valves 42 and 43 are closed, neither the cleaning water nor the process liquid is supplied to the processing tank 25. When the valve 42 is opened, wash water is supplied from the wash water tank 22 to the processing tank 25 through the supply line 41. When the valve 43 is opened, the process liquid is supplied from the process liquid tank 23 to the processing tank 25 through the supply line 41. In one example, the controller 21 switches the opening/closing of each of the valves 42 and 43 based on an operator's operation on an operation apparatus (not shown) such as a user interface. Switching of the opening/closing of each of the valves 42 and 43 is not necessarily performed by the controller 21, and in another example, switching of the opening/closing of each of the valves 42 and 43 may be performed by an operator without being mediated by the controller 21.

In the processing tank 25, the byproduct adhering to the introduced process target member 37 is detoxified by the process liquid supplied by the supplier 26. In one example, in the detoxification of the byproduct, the process liquid is supplied to the processing tank 25 after the process target member 37 is introduced into the processing tank 25. In another example, in the detoxification of the byproduct, the process liquid is supplied to the processing tank 25, and the process target member 37 is introduced into the processing tank 25 in a state where the supplied process liquid is stored in the processing tank 25. In the detoxification process, when the process liquid has accumulated to some extent in the processing tank 25, the valve 43 is closed to stop the supply of the process liquid to the processing tank 25.

As described above, the process liquid contains a basic aqueous solution. Halosilanes contained in the byproduct have a Si-$\alpha$ bond ($\alpha$ is one or more halogen elements selected from the group consisting of Cl, Br, F and I), and a Si—Si bond, as bonds showing high reactivity with water and oxygen as described above. By the reaction between the halosilanes and the basic process liquid, the aforementioned bonds showing high reactivity with water and oxygen are broken. For example, by the reaction between chlorosilanes and the basic process liquid, a Si—Cl bond and a Si—Si bond are broken.

The hydrolysate that can be contained in the byproduct can have a siloxane bond and a Si—Si bond that can be a cause of explosiveness, as described above. By the reaction between the hydrolysate and the basic process liquid, the aforementioned bonds that can be a cause of explosiveness are broken.

Therefore, the process liquid after the reaction with the byproduct is almost free of an explosive substance. By bringing the byproduct and the basic process liquid into contact with each other in the manner as described above, the byproduct is decomposed without generation of an explosive substance. That is, the byproduct generated in the reaction between the gas containing silicon and a halogen element and the substrate is safely detoxified.

By the detoxification reaction of the byproduct with the process liquid, a hydrogen halide can be generated. For example, when the byproduct contains chlorosilanes, hydrogen chloride (HCl) can be generated by the reaction between the process liquid and the byproduct. When the byproduct contains bromosilanes, hydrogen bromide (HBr) can be generated by the reaction between the process liquid and the byproduct. An aqueous solution of a hydrogen halide such as hydrogen chloride is acidic. Therefore, a pH of the process liquid tends to be low because of generation of a hydrogen halide by the reaction between the byproduct and the process liquid. In the present embodiment, since the hydrogen halide is neutralized by the process liquid by using the basic process liquid, a drop in pH of the process liquid can be prevented. Therefore, by using the basic process liquid, the safety of the process liquid after the reaction further improves.

Here, the basic aqueous solution contained in the process liquid contains at least one of an inorganic base and an organic base. As the inorganic base, for example, one or more selected from the group consisting of metal hydroxides, alkali metal salts, carbonates, hydrogencarbonates, metal oxides, and ammonium hydroxide ($NH_4OH$) are used. It is preferred that the inorganic base include, for example, one or more selected from the group consisting of hydroxides of alkali metal element, carbonates of alkali metal element, hydrogencarbonates of alkali metal element, hydroxides of alkali earth metal element, carbonates of alkali earth metal element, and ammonium hydroxide ($NH_4OH$). In particular, it is preferred that the inorganic base be one or more selected from the group consisting of sodium hydroxide (NaOH), potassium hydroxide (KOH), sodium carbonate ($Na_2CO_3$), calcium hydroxide ($Ca(OH)_2$), lithium hydroxide (LiOH), sodium hydrogencarbonate ($NaHCO_3$), and ammonium hydroxide ($NH_4OH$). In this case, since an inorganic base having low toxicity is used, the byproduct is treated more safely. It is more preferred that the inorganic base be one or more selected from the group consisting of potassium hydroxide (KOH), sodium carbonate ($Na_2CO_3$), lithium hydroxide (LiOH), sodium hydrogencarbonate ($NaHCO_3$), and ammonium hydroxide ($NH_4OH$). In this case, since the reaction between the process liquid and the byproduct progresses gently, the detoxification process of the byproduct is performed more safely.

As the organic base contained in the process liquid, for example, one or more selected from the group consisting of alkylammonium hydroxides, organic metal compounds, metal alkoxides, amines, and heterocyclic amines are used. It is preferred that the organic base be one or more selected from the group consisting of sodium phenoxide ($C_6H_5ONa$), 2-hydroxyethyl trimethylammonium hydroxide (choline hydroxide), and tetramethylammonium hydroxide (TMAH).

As the solvent of the process liquid, water is used. It is preferred that the pH of the process liquid be 8 or more and 14 or less before and after the detoxification process of the byproduct. The pH of the process liquid before the detoxification process is preferably 9 or more and 14 or less, and more preferably 10 or more and 14 or less. The process liquid may contain any ingredient such as a surfactant and a pH buffer in addition to at least one of an inorganic base and an organic base.

In the detoxification reaction of the byproduct by the process liquid, gas is generated. The gas generated in the reaction of detoxifying the byproduct includes hydrogen. The gas generated in the reaction of detoxifying the byproduct can contain a hydrogen halide such as hydrogen chloride. The exhauster (gas emitter) 27 exhausts the gas generated by the reaction between the byproduct and the process liquid from the processing tank 25. The exhauster includes an exhaust line 45. The exhaust line 45 is formed of, for example, one or more pipes. In the present embodiment, the exhaust line 45 is formed to extend from the processing tank 25 to the outside of the room (environment) where an operator conducts the operation. The gas generated in the reaction of detoxifying the byproduct is exhausted outside the room where an operator conducts operation via the exhaust line 45. In one example, the gas exhausted outside the room is collected and detoxified.

The gas generated in the reaction of detoxifying the byproduct is mainly hydrogen. Hydrogen is lighter than air. Therefore, it is preferred that the joint portion of the exhaust line 45 to the processing tank 25 be disposed in a vertically upper site in the internal space of the processing tank 25. In one example, the exhauster 27 includes a suction source (not shown) such as a suction pump. Then, by causing the sucking force to act on the internal space of the processing tank 25 and the exhaust line 45 by the suction source, the aforementioned gas is exhausted. In this case, driving of the suction source may be controlled by the controller 21.

The sensor 28 detects a parameter relating to the state of progress of the reaction between the process liquid and the byproduct in the detoxification process of the byproduct. The sensor 28 may be integrated with the processing tank 25, or may be detachably attached to the processing tank 25. In one example, the sensor 28 is provided separately from the processing tank 25, and need not be mechanically connected with the processing tank 25. The sensor 28 can include, for example, one or more of a pH measuring instrument, a Raman spectrum analyzer, an infrared spectroscopy (IR) analyzer, and a nuclear magnetic resonance (NMR) spectrum analyzer.

The pH measuring instrument measures a pH of the process liquid in the processing tank 25 in the detoxification process of the byproduct, as a parameter relating to the state of progress of the reaction between the process liquid and the byproduct. The Raman spectroscopic analyzer detects the Raman spectrum of the process liquid in the processing tank 25 in the detoxification process of the byproduct. In the detected Raman spectrum, the spectrum intensity in a specific wavelength region is acquired as a parameter relating to the state of progress of the reaction between the process liquid and the byproduct. The IR analyzer detects an IR spectrum of the process liquid in the processing tank 25 in the detoxification process of the byproduct. In the detected IR spectrum, the spectrum intensity in a specific wavelength region is acquired as a parameter relating to the state of progress of the reaction between the process liquid and the byproduct. The NMR spectrum analyzer detects an NMR spectrum of the process liquid in the processing tank 25 in the detoxification process of the byproduct. In the detected NMR spectrum, the spectrum intensity in a specific wavelength region is acquired as a parameter relating to the state of progress of the reaction between the process liquid and the byproduct.

In the present embodiment, the controller 21 acquires a detection result in the sensor 28. Then, the controller 21 determines the state of progress of the detoxification process of the byproduct based on the detection result in the sensor 28, and determines whether or not the byproduct has been detoxified properly. In one example, a notifying apparatus (not shown) that reports that the byproduct has been properly detoxified may be provided. In this case, when the controller 21 determines that the byproduct has been properly detoxified, the notifying apparatus is operated to report that the byproduct has been properly detoxified. The notification is performed by any one of emitting a sound, lighting, displaying on the screen, and the like. In one example, whether or not the byproduct has been properly detoxified may be determined by an operator instead of the controller 21. In this case, the operator acquires a detection result in the sensor 28, and determines whether or not the byproduct has been properly detoxified based on the acquired detection result.

As described above, by the reaction between the byproduct and the process liquid, a hydrogen halide is generated. An aqueous solution of a hydrogen halide is acidic. Therefore, as the detoxification process of the byproduct progresses, the pH of the process liquid decreases. Therefore, it becomes possible to appropriately determine the state of progress of the reaction between the process liquid and the byproduct based on the pH of the process liquid, and it becomes possible to appropriately determine the state of progress of the detoxification process.

By the reaction between the byproduct and the process liquid, the bonding state between atoms, the molecular structure, and the like change in components contained in the byproduct. For example, as described above, by the reaction between the byproduct and the process liquid, a Si-α bond (α represents one or more halogen elements selected from the group consisting of Cl, Br, F, and I) and a Si—Si bond are broken in halosilanes. By the reaction between the byproduct and the process liquid, a siloxane bond and a Si—Si bond are broken in the aforementioned hydrolysate. Therefore, as the detoxification process of the byproduct progresses, the bonding state between atoms, the molecular structure, and the like change in the mixture with the process liquid. Since the bonding state between atoms, the molecular structure and the like change in the mixture with the process liquid, the Raman spectrum, the IR spectrum, and the NMR spectrum also change with the detoxification process of the byproduct. Therefore, it becomes possible to appropriately determine the state of progress of the reaction between the process liquid and the byproduct based on the spectrum intensity of any one of the Raman spectrum, the IR spectrum, and the NMR spectrum, and it becomes possible to appropriately determine the state of progress of the detoxification process.

The jigs 30 maintain the respective process target members 37 in a predetermined posture in the process liquid in the processing tank 25. At this time, each of the process target members 37 such as the pipes to which the byproduct adheres is maintained in a state where one of the openings of the pipe faces vertically upward. That is, each of the process target members 37 is maintained in a state where one of the openings of the pipe faces the side where the liquid surface of the process liquid is located. As described above, in each of the process target members 37 in the process liquid, gas (hydrogen) is generated inside by the reaction of detoxifying the byproduct. In the present embodiment, since the posture of the process target member 37 is maintained by the jig 30 as described above, the gas (hydrogen) generated inside each of the process target members 37 flows toward the liquid surface of the process liquid through the openings facing vertically upward. Then, the gas is appropriately exhausted from the liquid surface of the process liquid through the exhaust line 45. Therefore, it is possible to effectively prevent bubbles of the gas generated by the reaction of detoxifying the byproduct from remaining inside each of the process target members.

In addition, in the present embodiment, since the posture of the process target member 37 is maintained by the jig 30 as described above, the contact between the process target members 37 and the contact of each of the process target members 37 with the inner wall of the processing tank 25 are effectively prevented in the process liquid. Therefore, in the detoxification process of the byproduct, damage to the process target member (pipe) 37 is effectively prevented.

The disperser 31 disperses the mass (condensed particles) of the byproduct in the process liquid in the processing tank 25 in parallel with the detoxification of the byproduct by the process liquid. The stirrer 32 stirs the process liquid in the processing tank 25 in parallel with the detoxification of the byproduct by the process liquid. The liquid circulator 33 forcibly forms a flow in which the process liquid circulates in the processing tank 25 in parallel with the detoxification of the byproduct by the process liquid. By performing any one of the dispersion of the mass of the byproduct by the disperser 31, the stirring of the process liquid by the stirrer 32, or the formation of the flow in which the process liquid circulates by the liquid circulator 33, the reaction between the byproduct and the process liquid is promoted, and the detoxification of the byproduct is promoted.

As the disperser 31, for example, any one of a high-speed rotation shearing type stirring device, a colloid mill, a roll mill, a high-pressure injection type dispersing device, an ultrasonic dispersing device, a bead mill, and a homogenizer can be used. In the high-speed rotation shearing type stirring device, by passing condensed particles (a mass) of the byproduct between a high-speed rotary blade and an outer cylinder, the mass of the byproduct is dispersed. In the colloid mill, by causing the mass of the byproduct together with the process liquid to flow between two rotating surfaces, a shear force is applied to the process liquid. Then, the mass of the byproduct is dispersed by the shear force of the process liquid. In the roll mill, by passing the mass (condensed particles) of the byproduct between two to three rotating rolls, the mass of the byproduct is dispersed. The high-pressure injection type dispersing device injects at high pressure the process liquid into, for example, a site of the process target member 37 to which the byproduct adheres. As a result, by collision between the process liquid and the process target member (pipe) 37, the mass of the byproduct is dispersed. The ultrasonic dispersing device generates ultrasonic vibration in the process liquid, and disperses the mass of the byproduct by the generated ultrasonic vibration. The bead mill uses beads (spheres) as media to disperse the mass of the byproduct. At this time, motion is imparted to the beads, and by collision between the beads, the mass of the byproduct is dispersed. The homogenizer applies a high pressure to the process liquid to generate a homogenizing valve in the process liquid. Then, the generated homogenizing valve passes through the inside or the like of the process target member (pipe) 37, whereby the mass of the byproduct is uniformly dispersed.

As the stirrer 32, either a pump or a rotary spring can be used. The pump forms a flow of the process liquid in the process liquid in the processing tank 25, thereby stirring the process liquid. The rotary spring rotates in the process liquid, thereby stirring the process liquid. Any of the above-described devices used as the disperser 31 can also be used as the stirrer 32. In this case, the aforementioned device stirs the process liquid in association with dispersion of the mass of the byproduct.

As the liquid circulator 33, a pump can be used. In the example of FIG. 2, the liquid circulator 33 such as a pump is provided in a circulation line 46 formed outside the processing tank 25. In this case, the liquid circulator forcibly forms the flow of the process liquid circulating inside of the processing tank 25 and the circulation line 46. By forming a flow in which the process liquid circulates in the processing tank 25, the process liquid is stirred. Therefore, the pump or the like used as the liquid circulator 33 is also used as the stirrer 32. The circulation line 46 is formed of one or more pipes, and is provided separately from the supply line 41 described above and a liquid emission line 47 described below. In one example, the circulation line 46 or the like outside the processing tank 25 is not provided, and the liquid circulator 33 forcibly forms a flow in which the process liquid circulates only inside the processing tank 25.

The controller 21 controls the operation of each of the disperser 31, the stirrer 32, and the liquid circulator 33. In one example, the controller 21 operates each of the disperser 31, the stirrer 32, and the liquid circulator 33 based on an operator's operation on an operation apparatus (not shown) such as a user interface. Then, the mass of the byproduct is dispersed by the operation of the disperser 31, the process liquid is stirred by the operation of the stirrer 32, and the flow in which the process liquid circulates is formed by the operation of the liquid circulator 33. In another example, any one of the disperser 31, the stirrer 32, and the liquid circulator 33 may be operated through an operator's operation or the like without being mediated by the controller 21.

In another example, the controller 21 may control the operation of each of the disperser 31, the stirrer 32, and the liquid circulator 33 based on the detection result in the sensor 28. In this example, for example, when it is determined that the progress speed of detoxification of the byproduct is slow based on the detection result in the sensor 28, the controller 21 operates any one of the disperser 31, the stirrer 32, or the liquid circulator 33. This accelerates the detoxification of the byproduct.

The liquid emitter 35 emits, from the processing tank 25, the process liquid that reacted with the byproduct in the processing tank 25. The waste liquid tank 36 stores the process liquid emitted from the processing tank 25. The liquid emitter 35 includes a liquid emission line 47 and a valve 48. The liquid emission line 47 is formed of, for example, one or more pipes. In the present embodiment, the processing tank 25 is connected to the waste liquid tank 36 via the liquid emission line 47. In the present embodiment, the operation of the valve 48 is controlled by the controller 21, and the opening/closing of the valve 48 is switched by the controller 21.

When the valve 48 is closed, the process liquid is not emitted from the processing tank 25. When the valve 48 is opened, the process liquid is emitted from the processing tank 25 to the waste liquid tank 36 through the liquid emission line 47. In one example, the controller 21 switches the opening/closing of the valve 48 based on an operation by an operator on an operation apparatus (not shown) such as a user interface. In this case, when the detoxification process of the byproduct is performed in the processing tank 25, the valve 48 is closed. When the detoxification process is completed, based on the operation by the operator, the controller 21 opens the valve to emit the process liquid from the processing tank 25. Switching of the opening/closing of the valve 48 is not necessarily performed by the controller 21, and in another example, switching of the opening/closing of the valve 48 may be performed by the operator without being mediated by the controller 21.

In another example, the controller 21 may switch the opening/closing of the valve 48 based on the detection result of the sensor 28. In this example, for example, when it is determined that the byproduct is appropriately detoxified based on the detection result of the sensor 28, the controller 21 opens the valve 48 to emit the process liquid from the processing tank 25.

In the present embodiment, when the process liquid is emitted from the processing tank 25, the valve 48 is closed. Then, the valve 42 is opened to supply wash water to the processing tank 25. Then, the process target member 37 is washed with the wash water.

As described above, by the process apparatus 20 and the process method using the process apparatus 20 of the present embodiment, the byproduct generated in the reaction between the gas containing silicon and the halogen element and the substrate is safely detoxified in the processing tank 25. The gas (hydrogen) generated by the reaction between the process liquid and the byproduct is properly exhausted by the exhauster 27. Since a parameter relating to the state of progress of the reaction between the process liquid and the byproduct in the processing tank 25 is detected by the sensor 28, it becomes possible to appropriately determine the state of progress of the detoxification of the byproduct based on the detection result in the sensor 28. In parallel with the detoxification of the byproduct, any one of the disperser 31, the stirrer 32, and the liquid circulator 33 is operated, thereby promoting the reaction between the byproduct and the process liquid, and promoting the detoxification of the byproduct.

Modifications

The process apparatus 20 is not necessarily provided with the aforementioned sensor 28. Furthermore, the process apparatus 20 is not necessarily provided with all of the disperser 31, the stirrer 32, and the liquid circulator 33, and in one modification, the process apparatus 20 may be provided with only any one or two of the disperser 31, the stirrer 32, and the liquid circulator 33. In another modification, none of the disperser 31, the stirrer 32, and the liquid circulator 33 may be provided in the process apparatus 20.

In the aforementioned embodiments and the like, part of the supply line 41 of the supplier 26 is commonly used for supply of wash water and for supply of process liquid; however, it is not limited to this. In one modification, the entire supply line of a process liquid from the process liquid tank 23 to the processing tank 25 may be formed independently of the supply line of wash water from the wash water tank 22 to the processing tank 25.

In one modification, the supply line 41 may not be connected to the processing tank 25. In this case, for example, the supplier 26 includes a faucet similar to a tap water faucet. Then, the process liquid is poured into the processing tank 25 by opening the faucet in a state where the processing tank 25 is disposed in the vicinity of the faucet. As a result, the process liquid is supplied to the processing tank 25, and the process liquid is stored in the processing tank 25. Moreover, in one modification, the supplier 26 is provided with two faucets. Then, by opening one of the faucets, the process liquid is poured into the processing tank 25. By opening the other faucet, wash water is poured into the processing tank 25.

In one modification, the supply line 41 may not be provided, and a transportable tank may be used as the process liquid tank 23. In this case, the process liquid is poured directly into the processing tank 25 from the process liquid tank 23 by an operator, and the process liquid is stored in the processing tank 25. At this time, the process liquid may be poured into the processing tank 25 using a funnel or the like. A transportable tank may also be used as the wash water tank 22. In this case, the wash water is poured directly into the processing tank 25 from the wash water tank 22 by the operator.

In one modification, in the detoxification process of the byproduct, first, a high-concentration process liquid may be supplied to the processing tank 25. In this case, after the high-concentration process liquid has accumulated to some extent in the processing tank 25, water is supplied to the processing tank 25, and the process liquid is diluted with the supplied water. Thereby, the process liquid having a concentration suitable for detoxifying the byproduct is stored in the processing tank 25. In one modification, in the detoxification process of the byproduct, first, water may supplied to the processing tank 25. In this case, in a state where only water is stored in the processing tank 25, the process target member 37 is introduced into the processing tank, and then any one of the aforementioned inorganic bases and/or any one of the aforementioned organic bases is added to water. Thus, the basic process liquid is stored in the processing tank 25. In one modification, after the process target member 37 is introduced into the processing tank 25, water may be first supplied to the processing tank 25. In this case as well, after the water is stored in the processing tank 25, any one of the aforementioned inorganic bases and/or any one of the aforementioned organic bases is added to water. As a result, the basic process liquid is stored in the processing tank 25.

In the above-described embodiments, etc., the liquid emitter 35 is provided with the liquid emission line 47, but the liquid emission line 47 is not necessarily included. In one modification, the liquid emitter 35 may not be provided with the liquid emission line 47, and the liquid emitter 35 may include a valve to be attached to the processing tank 25. In this case, at the time of emitting the process liquid that reacted with the byproduct from the processing tank 25, the valve is opened to eject the process liquid from the valve to the outside of the processing tank 25. The process liquid emitted from the valve is received by the waste liquid tank 36, so that the process liquid is collected in the waste liquid tank 36.

According to the process apparatus and the process method of at least one embodiment or example, the byproduct is subject to the process in the processing tank with the process liquid containing the basic aqueous solution. The gas generated by reaction between the process liquid and the byproduct is exhausted from the processing tank. Accordingly, it is possible to provide a process apparatus and a process method that safely perform processing on a byproduct generated in a reaction of a raw material substance containing silicon and a halogen element or a reaction between a raw material substance containing silicon and a raw material substance containing a halogen element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A process apparatus that performs processing on a byproduct generated in a reaction of a raw material including silicon and a halogen element or in a reaction between a raw material including silicon and a raw material including a halogen element, the apparatus comprising:
    a process liquid tank that stores process liquid including a basic aqueous solution;
    a processing tank into which a process target member including the byproduct is introduced;
    a supplier that supplies the process liquid from the process liquid tank to the processing tank and performs processing on the byproduct in the processing tank with the supplied process liquid;
    an exhauster that exhausts a gas generated by reaction between the process liquid and the byproduct from the processing tank; and
    a jig that maintains the process target member in a predetermined posture in the process liquid in the processing tank, and in a state where an opening of a pipe of the process target member faces a side where a liquid surface of the process liquid is located.

2. The process apparatus according to claim 1, further comprising a sensor that detects a parameter relating to a state of progress of the reaction between the process liquid and the byproduct in the processing tank.

3. The process apparatus according to claim 1, further comprising one or more of:
    a disperser that disperses a mass of the byproduct in the process liquid in the processing tank;
    a stirrer that stirs the process liquid in the processing tank; and
    a liquid circulator that forms a flow in which the process liquid circulates in the processing tank.

4. The process apparatus according to claim 1, further comprising a liquid emitter that emits, from the processing tank, the process liquid which reacted with the byproduct in the processing tank.

5. A process method performed on a byproduct generated in a reaction of a raw material including silicon and a halogen element or in a reaction between a raw material including silicon and a raw material including a halogen element, the method comprising:
    introducing a process target member including the byproduct into a processing tank;
    storing process liquid including a basic aqueous solution in the processing tank;
    maintaining the process target member in a predetermined posture in the process liquid in the processing tank, and in a state where an opening of a pipe of the process target member faces a side where a liquid surface of the process liquid is located;
    performing processing on the byproduct in the processing tank with the stored process liquid; and
    exhausting a gas generated by reaction between the process liquid and the byproduct from the processing tank.

6. The method according to claim 5, further comprising detecting a parameter relating to a state of progress of the reaction between the process liquid and the byproduct in the processing tank, and determining a state of progress of processing on the byproduct based on a detection result of the parameter.

7. The method according to claim 5, further comprising performing, in parallel with detoxification of the byproduct with the process liquid, one or more of:
    dispersing a mass of the byproduct in the process liquid in the processing tank;
    stirring the process liquid in the processing tank; and
    forming a flow in which the process liquid circulates in the processing tank.

8. The method according to claim 5, further comprising emitting, from the processing tank, the process liquid which reacted with the byproduct in the processing tank.

* * * * *